United States Patent
Hamzeh

(10) Patent No.: US 9,100,339 B1
(45) Date of Patent: Aug. 4, 2015

(54) NETWORK FAILURE DETECTION AND PREDICTION USING SIGNAL MEASUREMENTS

(71) Applicant: Cable Television Laboratories, Inc., Louisville, CO (US)

(72) Inventor: Belal Hamzeh, Westminster, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

(21) Appl. No.: 14/226,977

(22) Filed: Mar. 27, 2014

(51) Int. Cl.
H04L 12/26 (2006.01)

(52) U.S. Cl.
CPC ............ *H04L 43/50* (2013.01); *H04L 43/0847* (2013.01)

(58) Field of Classification Search
CPC . H04L 43/50; H04L 43/0847; H04L 41/0659; H04L 45/02; H04L 41/06; H04L 41/0618; H04L 12/1863; H04L 12/66; H04L 29/1249; H04L 41/042; H04L 41/0663; H04L 41/0668; H04L 41/0853; H04L 41/0856
See application file for complete search history.

(56) References Cited

U.S. PATENT DOCUMENTS

| | | | | |
|---|---|---|---|---|
| 8,520,696 | B1* | 8/2013 | Corral et al. | 370/463 |
| 8,665,992 | B1* | 3/2014 | Eliaz | 375/298 |
| 2004/0052534 | A1* | 3/2004 | Joergensen | 398/177 |
| 2005/0259565 | A1* | 11/2005 | Fujii et al. | 370/203 |
| 2007/0036239 | A1* | 2/2007 | Ma et al. | 375/316 |
| 2010/0048151 | A1* | 2/2010 | Hara | 455/115.1 |
| 2010/0098422 | A1* | 4/2010 | Takeda | 398/79 |
| 2011/0149929 | A1* | 6/2011 | Kleider et al. | 370/338 |
| 2011/0274148 | A1* | 11/2011 | Urban et al. | 375/222 |
| 2012/0040602 | A1* | 2/2012 | Charland | 455/1 |
| 2012/0142275 | A1* | 6/2012 | Nishio | 455/67.11 |
| 2012/0263247 | A1* | 10/2012 | Bhattad et al. | 375/260 |
| 2013/0109317 | A1* | 5/2013 | Kikuchi et al. | 455/41.2 |
| 2013/0201316 | A1* | 8/2013 | Binder et al. | 348/77 |
| 2013/0259174 | A1* | 10/2013 | Qian et al. | 375/346 |
| 2014/0266460 | A1* | 9/2014 | Nobbe et al. | 330/295 |
| 2014/0274094 | A1* | 9/2014 | Abdelmonem et al. | 455/452.1 |

* cited by examiner

*Primary Examiner* — Hirdepal Singh
(74) *Attorney, Agent, or Firm* — Great Lakes Intellectual Property, PLLC

(57) ABSTRACT

Network health monitoring and network failure detection prediction using opportunistic scheduling and measurement is contemplated. The health monitoring may be facilitated with opportunistic scheduling and measurement of pilot power in various bands to detect harmonics induced by equipment suffering from non-linearity or other distortions.

15 Claims, 3 Drawing Sheets

NETWORK FAILURE DETECTION AND PREDICTION USING SIGNAL MEASUREMENTS

TECHNICAL FIELD

The present invention relates to facilitating network failure detection and prediction using measurements, such as but not necessarily limited to identifying non-linear performance as a function of energy measurements associated with multiple band pilot signals.

BACKGROUND

A wireless, wireline or combined wireless-wireline network may rely on any number of devices to process signals for transport. The health, operational status or other characteristics related to the performance of these devices may be important to maintaining proper operation of the network and desired levels of service. A service provider may be tasked with supporting larger, wide area networks, such as but not necessarily limited to those associated with a hybrid-fiber cable (HFC) network, a cable network, a cellular network, an optical network or other network providing long-haul signaling transport, as well as smaller, local area networks, such as a home wireless/wireline network, Wi-Fi hotspot or other network interconnecting user devices with the long-haul transport network. One non-limiting aspect of the present invention contemplates providing such service providers and other interested entities with an ability to identify health, operational status or other characteristics of devices within their networks, optionally identifying such characteristics for devices at an individual level.

BRIEF DESCRIPTION OF THE DRAWINGS

FIG. 4 illustrates a flowchart of a method for identifying device performance in accordance with one non-limiting aspect of the present invention.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
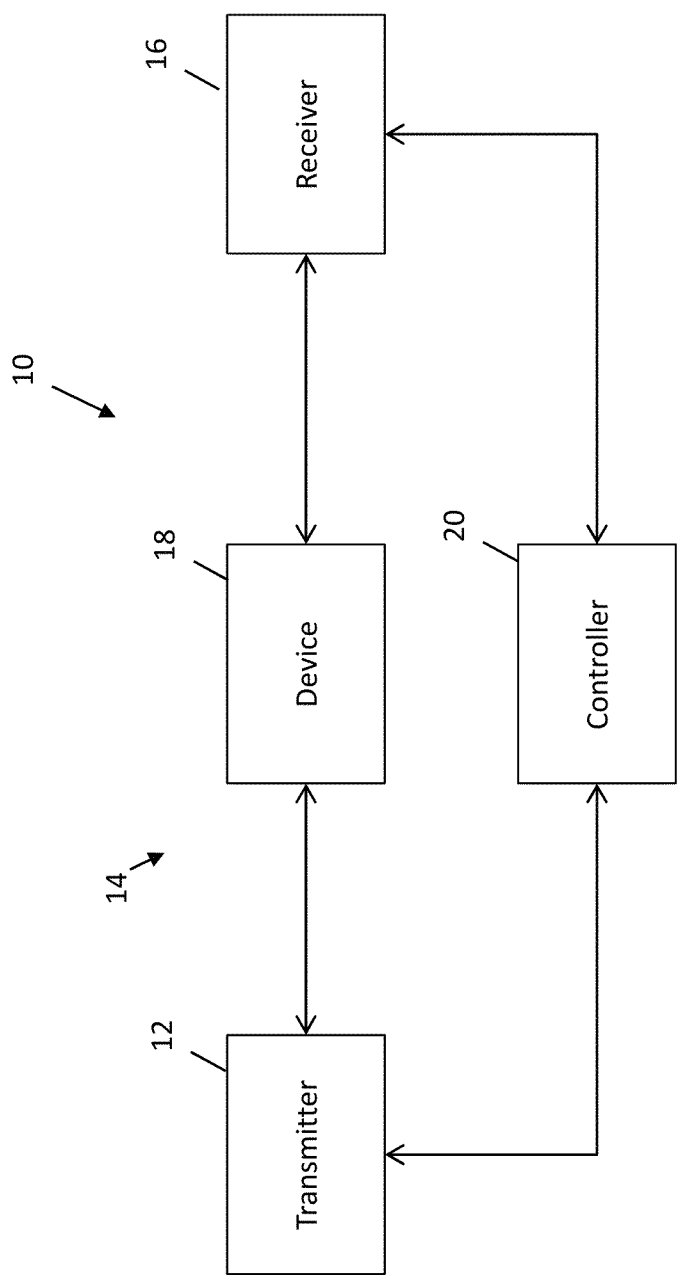
FIG. 1 illustrates a system for transporting signals in accordance with one non-limiting aspect of the present invention.

FIG. 1 illustrates a system 10 for transporting signals in accordance with one non-limiting aspect of the present invention. The system 10 is shown with respect to a transmitter 12 being configured to transport signaling over a network 14 for receipt at a receiver 16. The receiver 16 may be configured to further process the transported signaling for output to a device (not shown) and/or interfacing with a user. The system 10 may be configured to facilitate transporting virtually any type of signaling between a first location/device (e.g., the transmitter 12) and a second location/device (e.g., the receiver 16). Optionally, the signaling transported over through the network 14 may traverse one or multiple wired and/or wireless mediums before reaching the receiver 16, such as in the manner described in the patent applications referenced above and/or described in U.S. patent application Ser. No. 14/181, 640, filed Feb. 15, 2014, and entitled Multiple-Input Multiple-Output (MIMO) Communication System, the disclosure of which is hereby incorporated by reference in its entirety. The relationship of the transmitter 12 and the receiver 16 is shown for exemplary non-limiting purposes as the present invention fully contemplates the transmitter 12 acting as a receiver or a client in some circumstances and the receiver 16 acting as a transmitter or a server in some circumstance.

The network 14 is shown to include a device 18 disposed between the transmitter and receiver 12, 16. The device 18 may be one of many devices included as part of the network 14 or otherwise associated with one or both of the transmitter and/or the receiver 12, 16 to facilitate signaling. The device 18, like the transmitter and the receiver 12, 16, may be any type of element having capabilities sufficient to facilitate processing signaling traveling between the transmitter and receiver 12, 16 and/or any other device connected thereto or otherwise in communication therewith. FIG. 1 illustrates an exemplary positioning of the device 18 relative to the transmitter and receiver 12, 16 in order to demonstrate an ability of present invention to assess the health, operational status or other characteristics of the device 18 when processing signals communicated from the transmitter 12 to receiver 16 over the network 14. The device 16 may be disposed in any position within the network 14 and need not necessarily be disposed between the transmitter and the receiver 12, 16. The network 14 also need not possess the capabilities to facilitate signaling or message routing and instead may be a testing environment where the transmitter 12 is a signaling source and the receiver 16 is a sink capable of enabling the device 18 to output the processed signaling, e.g., the present invention may be useful and testing devices 18 prior to being deployed within an operational network.

The present invention is predominantly described with respect to facilitating identifying performance of the device 18 when the network 14 is a fully operational network. The use of the present invention with fully operational networks 14 may be beneficial as such networks 14 may include many devices 18 and the present invention may be utilized to individually identify any improperly performing one or more of the devices 18. The device 18 may be operable within any public or private network 14 and include capabilities sufficient to facilitate processing of signals transmitted according to but not limited to Orthogonal Frequency Division Multiplexing (OFDM), Orthogonal Frequency Division Multiple Access (OFDMA), Single Carrier Frequency Division Multiple Access (SC-FDMA), and any other modulation technique that allow granular allocation of signals in narrow frequency bands. The device 18 may be configured to facilitate processing signals communicated according to any number of standards and/or protocols, such as but not necessary limited to Data Over Cable Service Interface Specifications (DOCSIS) 3.1, Long Term Evolution (LTE), LTE-Advanced (LTE-A), Wi-Max, Wi-Fi, Digital Video Broadcasting-Terrestrial (DVB-T), Digital Video Broadcasting-Handheld (DVB-H), etc., the disclosures of which are hereby incorporated by reference in their entireties. One non-limiting aspect of the present invention contemplates the device 18 being an amplifier configured to linearly amplify signaling. Of course, the present invention is not necessarily limited to amplifiers and fully contemplates its use and application of facilitating identifying performance of other devices 18, including fiber optic transmitters and receivers, LEDs, Laser Transmitters, Laser Receivers and Photo diodes.

The system 10 may include a controller 20 to assess performance of the device 18. The controller 20, or other element tasked with undertaking the performance identification contemplated herein, may include a non-transitory computer-readable medium having a plurality of instruction operable with a processor and sufficient for identifying performance of the device 18, including actual performance or predicted performance. The controller 20 is shown for exemplary non-limiting purposes as being in communication with the transmitter and receiver 12, 16. The controller 20 may use this communication capability to facilitate instructing the transmitter 12 to transmit particular signaling to the receiver 16 and to determine the signals actually received by the receiver 16, i.e., the signals as processed by the device 18. In the event to the present invention is employed within a operational network or network 14 having a plurality of devices 18, the controller 20 may include capabilities sufficient for selectively directing signaling to desired ones of the devices 18 and/or measuring signals output therefrom. Of course, the present invention is not necessarily so limited and fully contemplates the controller 20 being otherwise arranged relative to the transmitter 12, the receiver 16 and/or the device 18. Optionally, the controller 20 may be a more passive device, e.g., instead of actively instructing the transmitter 12 and/or the receiver 16 to transmit signals and to report received signals, the controller 20 may be configured to monitor signals input to or output from the device 18 and/or signals transmitted from the transmitter 12 and received at the receiver 16 independently of instructions from the controller.

The controller 20 may be configured in accordance in the present invention to facilitate identifying equipment failure or other equipment related performance, and is for exemplary non-limiting purposes predominantly described with respect to identifying performance for the device 18 being configured as an amplifier. The amplifier 18 may be configured to amplifier, attenuate or otherwise processed signaling communicated therethrough, e.g., the amplifier 18 may be a linear device configured to perform linear operations on the signaling. The controller 20 may be configured to identify the performance of the amplifier 18 or other linearly operating RF component using opportunistically placed pilots, such as but not necessary limited to those used within OFDM/OFDMA frames. The opportunistically placed pilots or test signals may be processed with the amplifier 18, optionally along with any additional signaling passing therethrough, so as to enable the controller 20 to identify/predict performance, failure, non-linearity, etc. as a function of how the amplifier processes the pilots (nulls). OFDM/OFDMA and similar technologies may allow granular allocation of signals in narrow frequency bins whereby the overall signal is composed of parallel signal transmission across frequency bins that compose the complete bandwidth (spectrum), such as in the manner described in United States an application Ser. No. 13/759,908, filed Feb. 5, 2013, and entitled Transmission Opportunity Scheduling, the disclosure of which is hereby incorporated by reference in its entirety.

The output of non-linear operating amplifiers may be described by a Taylor series:

$$f(x)=Ax+Bx^2+Cx^3+\ldots$$

Based on this, the output of the non-linear operating amplifier 18 may include higher order harmonics ($2^{nd}$, $3^{rd}$, etc. order harmonics) due to the mixing of frequencies. For example, the mixing of two frequencies (f1,f2 such that f2>f1) due to second order non-linearity will generate signals at f1+f2, f2−f1, $2xf1, 2xf2$, and similarly, $3^{rd}$ order non-linearity will generate signals at $3xf1$, $3xf2$, $2xf1-f2$, $2xf2-f1$, etc. The present invention contemplates facilitating performance identification for wired or wireless systems using OFDM/OFDMA modulation (such as DOCSIS 3.1, LTE, LTE-A, WiMAX, WiFi, DVB-T, DVB-H, etc.) to detect whether an RF front end amplifier or other linearly operational device is failing or over-driven and operating in the non-linear region and thus requires maintenance/repair. The controller 20 may be configured in accordance with the present invention to facilitate this assessment by instructing the transmitter 12 (CMTS/eNode-B, Base Station, Access point, etc.) to select one or more frequency bins (f1,f2, . . . fn) and two symbol slots (t1,t2) for the pilots, optionally back to back, that shall be monitored by the receiver 16, i.e., following processing by the device 18 under test.

Figure 2:
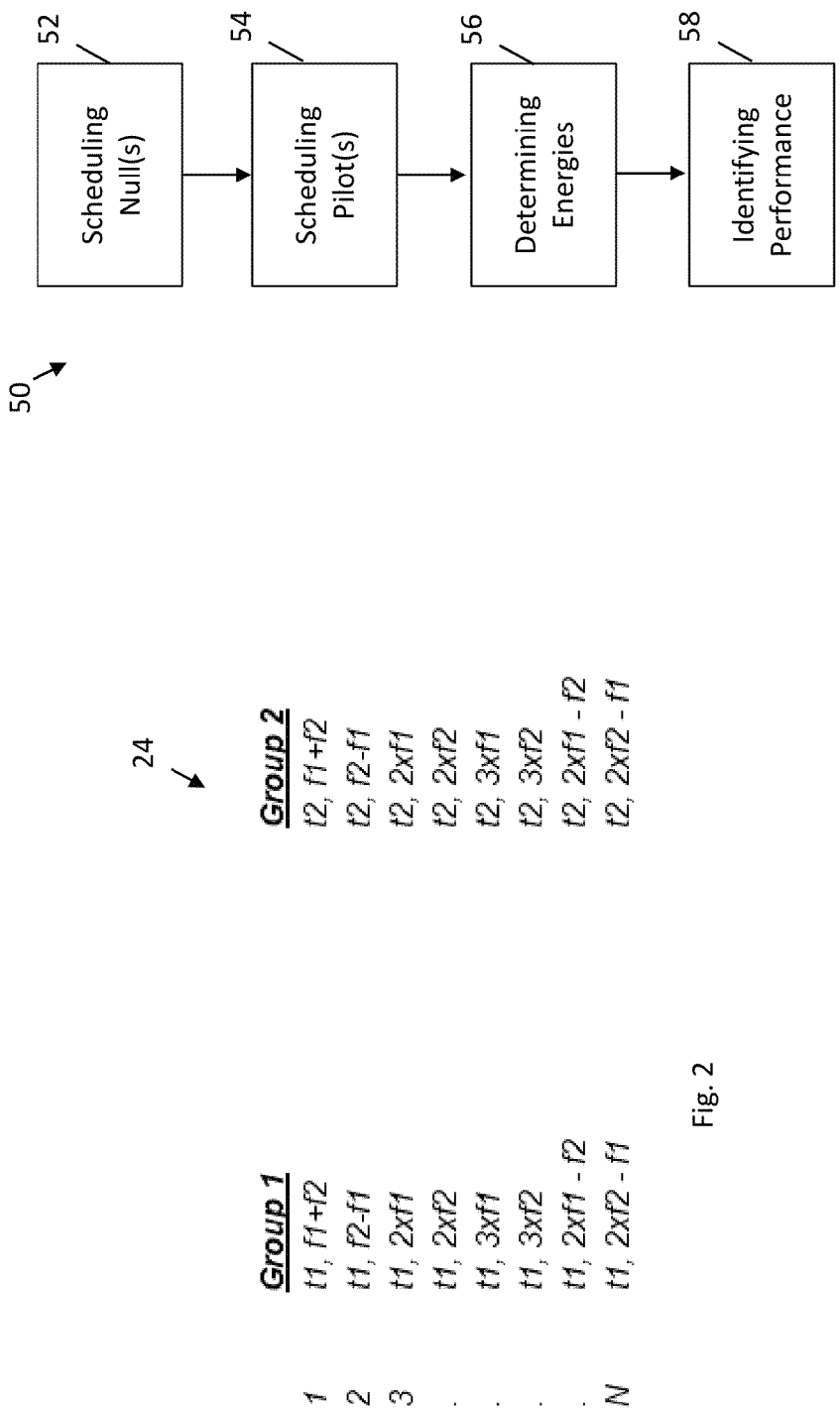
FIG. 2 illustrates measured energies in accordance with one non-limiting aspect of the present invention.

The controller 20 may be configured to schedule or otherwise enable the transmitter 12 to send no energy in certain allocations [(t1,f1), (t1,f2), . . . (t1,fn)], i.e. the no energy allocations may be nulled to include essentially no energy, and to schedule or otherwise enable the transmitter 12 to send a known symbol or pilot in certain allocations [(t2,f1), (t2,f2), . . . (t2,fn)], i.e., the energized allocations may include a known amount of energy. The controller 20 may be configured to schedule or otherwise enable the transmitter 12 to send no energy at allocations that correspond to the second and third harmonic components, or other harmonics, during t1 and t2 such as the allocations 24 shown in FIG. 2 if possible (if the allocation falls within the operating spectrum). To detect network impairments due to amplifier problems, the receiver 18 may be configured to measure the energy levels at allocations that correspond to the second and third harmonic components, or other harmonics, during t1 and t2. (The harmonic components being monitored may be dependent on the selected frequency bins.) If the transmitter 12 decides to use two frequency bins (f1,f2 such that f2>f1), then the receiver 18 may be configured to measure the energy in some or all of the allocations 24 shown in FIG. 2 if possible (if the allocation falls within the operating spectrum). If the signal energy in the t2 symbol slots are measured to be higher than the signal energy in the t1 symbol slots, then this may be an indication that the amplifier 18 is causing signal distortion and generating second and third order harmonics (e.g., composite triple beat and composite second order distortions).

Figure 3:
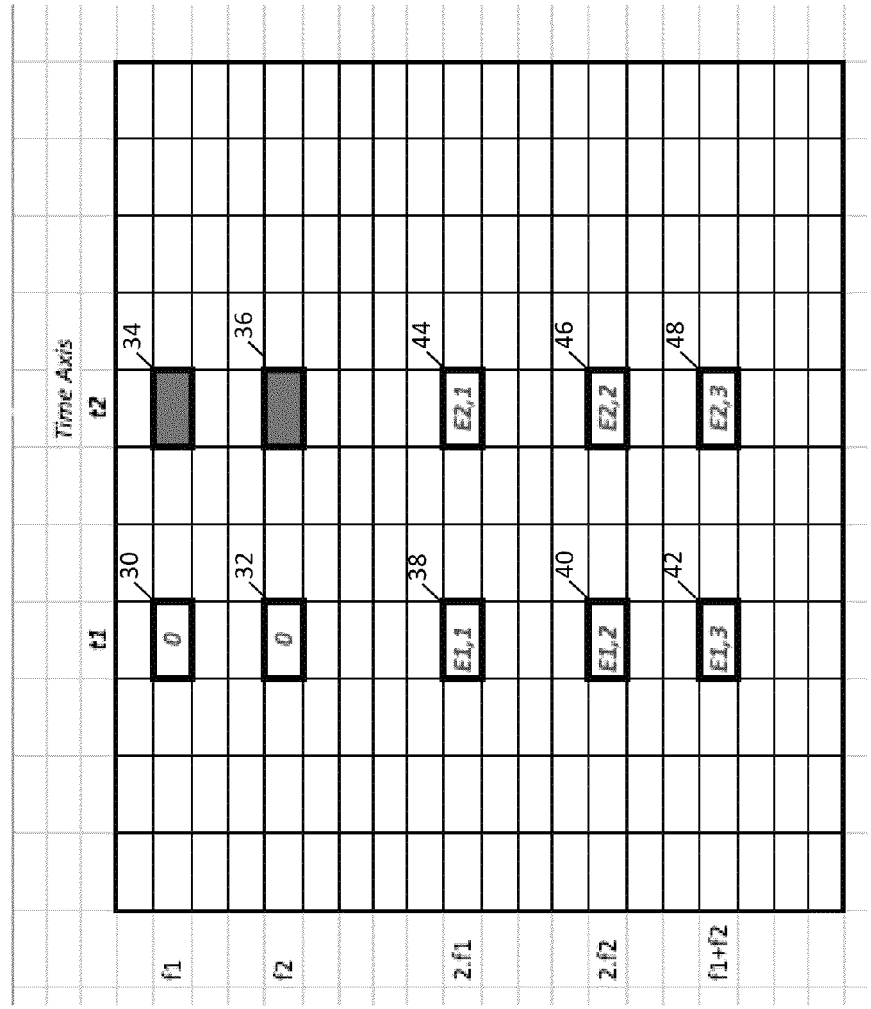
FIG. 3 schematically illustrates a diagram for detecting non-linear performance of the device in accordance with one non-limiting aspect of the present invention.

FIG. 3 schematically illustrates a diagram 26 for detecting non-linear performance of the device 18 in accordance with one non-limiting aspect of the present invention. The diagram 26 illustrates the controller 20 selecting two frequency bands f1 and f1 and two symbol slots t1 and t2 to facilitate transmission of a first null 30 and a second null 32 and a first pilot 34 and a second pilot 36. The first and second nulls 30, 32 may correspond with the transmitter 12 transmitting a pilot with essentially no energy during a time associated with t1 for frequencies f1 and f2 and the first and second pilots 34, 36 may correspond with the transmitter 12 transmitting a pilot with a sufficient amount of energy, which may be selectable, during a time associated with t2 for frequencies f1 and f2. In the event the transmitter 12 is associated with a cable modem termination system (CMTS) and/or a cable modem (CM), the first and second nulls 30, 32 and the first and second pilots 34, 36 may be scheduled for transmissions over the network 14 or other medium associated with the device 18, such as in the manner described in U.S. Pat. No. 8,351,465, filed Jun. 30, 2010, and entitled System and Method of Decoupling Media Access Control (MAC) and Physical (PHY) operating layers, the disclosure of which is hereby incorporated by reference in its entirety.

A sample of the energy resulting from the amplifier 18 processing the first and second nulls 30, 32 and the first and second pilots 34, 36 is shown to correspond with a plurality of energies 38, 40, 42, 44, 46, 48, each of the plurality of energies 38, 40, 42, 44, 46, 48 may be represent energy within the amplifier processed signaling. The energy may represented random noise associated within the first and second nulls 30, 32. Also the energy may represent higher order harmonics associated with the corresponding first and second pilots 34, 36. A first energy (E1,1) 38 is shown to represent energy within a second order harmonic for time t1, a second energy (E1,2) 40 is shown to represent energy within a second order harmonic for time t1 and a third energy (E1,3) 42 is shown represent energy within a second order harmonic for time t1. In this manner, any energy present in the higher order harmonics of the nulls 30, 32 may be determined by measuring the corresponding harmonic. A fourth energy (E2,1) 44, a fifth energy (E2,2) 46 and a sixth energy (E2,3) 48 for time t2 may be measured to represent any energy within the corresponding harmonics of the first and second pilots 34, 36. While measurement of harmonics is shown for each of the first and second times t1, t2, additional harmonics may be similarly measured at a corresponding frequency in order to identify mixing occurring at other higher order harmonics.

The controller 20 may be configured in accordance with the present invention to analyze the energies for the purposes of identifying performance of the amplifier 18 or other device under test. In the event the amplifier 18 is configured to linearly operate, the energies found within any of the higher order harmonics (e.g., second, third, fourth, etc.) should be essentially zero. In other words, the first energy 38 should equal the fourth energy 44, the second energy 40 should equal the fifth energy 46, and the third energy 42 should equal the sixth energy 48 if the amplifier is operating properly (residual or other energy may still be present in the harmonics even when operating properly due to interference or other signaling leakage such that the energies may not be zero). The controller 20 may calculate a difference in each of the energies 38, 40, 42, 44, 46, 48 and analyze that difference to predict and/or identify non-linear performance of the amplifier 18 in order to compensate for leakage or other interferences preventing a zero energy determination. This may be accomplished by determining a difference between the first and fourth energy 38, 44, the second and fifth energy 40, 46 and the third and sixth energy 42, 48 If any one of the corresponding differences are greater than a threshold, the amplifier 18 may be determined to be performing non-linearly. The threshold may be set to a value greater than zero in order to enable the presence of interference, leakage or other acceptable energies within the measurements.

The difference values may also be analyzed to determine or predict future behavior and performance of the amplifier 18. The illustrated energy measurements 38, 40, 42, 44, 46, 48 may be repeated for additional times/minislot (optionally including both nulls and pilots and/or multiple pilots occurring after a single or benchmarked null) with the same frequency parameters so as to measure performance of the amplifier 18 over time. A graph or trend made be developed based on the differences measured over time in order to gauge whether the differences are steady, increasing, decreasing, etc. over time. In the event the differences are increasing, it may be assumed that amplifier performance is degrading. A useful life of the amplifier 18 may be known or estimated such that the trend may be utilized to predict a percentage of life remaining in the amplifier prior to failure or non-linear performance, e.g., if the differences are 50% more than when the amplifier 18 was originally deployed, then it may be assumed that the amplifier 18 has 50% of its useful life remaining. The difference values may also be analyzed to determine a harmonic most responsible for the determined non-linear performance or predicted non-linear performance. This dominant harmonic may correspond with the one of the higher order harmonics associated with the greatest difference, i.e., the one of the higher order harmonics exhibiting the greatest difference between time t1 and time t2 or over some other interval of time.

The controller 20 may be configured to facilitate directing the transmitter 12 to test multiple devices 18 with the use of opportunistically selected nulls and pilots being unicasted or otherwise targeted to particular devices 18, optionally by way of directing signals to an associated receiver 16, and/or being multicasted or otherwise targeted to multiple devices 16 simultaneously. The controller 20 may include capabilities to determine the energy measurement for each device 18 in response to the opportunistic nulls and pilots from an associated receiver 16, and in the event energy measurements cannot be ascertained from one of the receivers 16, a sensor or other means may be used to measure the processed signaling. By comparing the results from various receivers, and identifying which ones are observing distortions in the network 14 and which are not, the location of the network element 18 that is causing distortion can be identified. In DOCSIS 3.1 or wired systems, the knowledge of the geographical locations of various CMs may be used to provide accurate pinpointing to which amplifier 18 is causing the distortion. For LTE/LTE-A systems, the ability to identify performance for individual devices 18 may be beneficial with dense, small cell/femto cell/picocell/DAS deployments, as this will enable the operator to track and check performance of the RF front ends without the need to have a technician check every cell site 18 manually.

FIG. 4 illustrates a flowchart 50 of a method for identifying device performance in accordance with one non-limiting aspect of the present invention. The method is described with respect to a controller being configured to facilitating instructing a transmitter to opportunistically transmit nulls and pilots to a receiver in order to identify performance of one or more devices positioned therebetween. The method is described for exemplary non-limiting purposes with respect identifying non-linear performance, such as in accordance with the above described Taylor series where non-linear performance may be identified when higher order harmonics are recognized. The non-linear performance may be assumed in the event higher order harmonic energies for a pilot exceed a corresponding null or other non-energy marker. The use of opportunistic nulls and pilots may be particularly beneficial with devices operating according to a transmission schedule having the capabilities to selectively transmit nulls and pilots are different frequencies and units of time. The pilots, or non-nulled portions of the test signals, may consume little bandwidth and may be selectively transmitter during periods in which their usage is unlikely to strain the capabilities of a corresponding network.

Block 52 relates to scheduling one or more nulls for processing with the device being tested. The nulls may correspond with selectable portions of the signaling being processed by the device, such as at the above-identified frequencies f1 and f2 for time t1, being transmitted with no energy. Block 54 relates to scheduling one or more pilots for processing with the device being tested. The pilots may correspond with selectable portions of the signaling being processed by the device, such as at the above-identified frequencies f1 and f2 for time t2, being transmitted with at least some measurable energy. Block 56 relates to determining energies generated with the device in response to the signaling at particular frequencies for the time periods associated with the nulls and pilots, e.g., time t1 and t2. While any frequency may be measured, the frequencies associated with the higher order harmonics, i.e., the harmonics of frequencies f1 and f2, may be targeted in order to identify non-linear performance. Block 58 relates to identifying performance. The performance may be identified by comparing energies or other measurables to determine differences while the device processes signals during a time period having the contemplated nulls and while the device processes signaling during a time prior having the contemplated pilots, e.g., determining non-linearity if a sufficient difference in energy exists for one or more of the higher order harmonics when comparing nulled signaling to non-nulled signaling.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for identifying non-linear performance of an amplifier configured to linearly amplify signaling transmitted within a network, the method comprising:
   determining a first energy representative of energy within the signaling at a first frequency and a first time;
   determining a second energy representative of energy within the signaling at the first frequency and a second time, the second time occurring either before or after the first time;
   identifying non-linear performance of the amplifier in the event a first difference between the first energy and the second energy is greater than a threshold;
   determining a third energy to represent energy within the signaling at a second frequency and the first time;
   determining a fourth energy to represent energy within the signaling at the second frequency and the second time;
   determining a second difference between the third energy and the fourth energy being greater than the threshold; and
   determining a non-linearity level for the amplifier to correspond with a greater one of the first difference and the second difference, the non-linearity level representing a dominant higher order harmonic contributing to the non-linear performance to be the first frequency if the first difference is greater and to be the second frequency if the second difference is greater.

2. The method of claim 1 further comprising selecting the first frequency and the first time to correspond with a null being transmitted within the signaling.

3. The method of claim 2 further comprising selecting the first frequency to correspond with a higher order harmonic of the null during the first time.

4. The method of claim 1 further comprising selecting the first frequency and the second time to correspond with a pilot being transmitted within the signaling.

5. The method of claim 4 further comprising selecting the first frequency to correspond with a higher order harmonic of the pilot during the first time.

6. The method of claim 1 further comprising selecting the first frequency to correspond with a first one of a plurality of higher order harmonics associated with a third frequency of a null being transmitted during the first time and selecting the second frequency to correspond with a second one of the plurality of higher order harmonics.

7. The method of claim 6 further comprising selecting the second time to correspond with a pilot being transmitted at the third frequency.

8. The method of claim 1 further comprising selecting the second time to correspond with a minislot adjoining the first time, the minislot representing a unit of time in a transmission schedule used to schedule transmission of the signaling.

9. The method of claim 1 further comprising generating a prediction value for the amplifier in the event the first difference is less than the threshold, the prediction value indicating a percentage of linear life remaining in the amplifier.

10. The method claim 9 further comprising determining the prediction value based on a trend associated with the first difference value and a plurality of previously recorded difference values determined for the amplifier.

11. A non-transitory computer-readable medium having non-transitory instructions, operable with a processor, sufficient for identifying non-linear performance within a network, the network including a transmitter for transmitting signaling to a receiver, the non-transitory instructions being sufficient for:
   instructing the transmitter to transmit the signaling to the receiver at a first time with a first null at a first frequency, the first null essentially including no energy;
   instructing the transmitter to transmit the signaling to the receiver at a second time with a first pilot at the first frequency, the first pilot including a first amount of energy;
   determining a first energy of the signaling received at the receiver at a second frequency for the first time, the second frequency being a first higher order harmonic of the first frequency;
   determining a second energy of the signaling received at the receiver at the second frequency for the second time;
   determining non-linear performance within the network based on a comparison of the first energy to the second energy; and
   determining non-linear performance in the event a first difference between the first energy and the second energy is greater than a threshold.

12. The non-transitory computer-readable medium of claim 11 further comprising instructions sufficient for:
   instructing the transmitter to transmit the signaling to the receiver at the first time with a second null at a third frequency, the second null essentially including no energy;
   instructing the transmitter to transmit the signaling to the receiver at the second time with a second pilot at the third frequency, the second pilot including a second amount of energy;
   determining a third energy of the signaling received at the receiver at a fourth frequency for the first time, the fourth frequency being a second higher order harmonic of the first frequency, the second higher order harmonic being different than the first higher order harmonic;
   determining a fourth energy of the signaling received at the receiver at the fourth frequency for the second time;
   determining a second difference between the third energy and the fourth energy; and
   determining non-linear performance within the network based on a comparison of the third energy to fourth second energy.

13. The non-transitory computer-readable medium of claim 12 further comprising instructions sufficient for, when both of the first difference and the second difference are greater than the threshold, determining a dominant harmonic causing non-linear performance to correspond with the first higher order harmonic if the first difference is greater than the second difference and determining the dominant harmonic causing non-linear performance to correspond with the second higher order harmonic if the second difference is greater than the first difference.

14. The non-transitory computer-readable medium of claim 11 further comprising instructions sufficient for directing the transmitter when included at a cable modem termination system (CMTS), an eNode-B, a cable modem (CM) and a wireless access point.

15. A method for identifying non-linear performance within a network, the network including a transmitter for transmitting signaling to a receiver, the method comprising:
   instructing the transmitter to transmit the signaling to the receiver at a first time with a first null at a first frequency, the first null essentially including no energy;
   instructing the transmitter to transmit the signaling to the receiver at a second time with a first pilot at the first frequency, the first pilot including a first amount of energy;
   determining a first energy of the signaling received at the receiver at a second frequency for the first time, the second frequency being a first higher order harmonic of the first frequency;
   determining a second energy of the signaling received at the receiver at the second frequency for the second time;
   determining non-linear performance within the network based on a comparison of the first energy to the second energy;
   instructing the transmitter to transmit the signaling to the receiver at a third time with a second null at the first frequency;
   instructing the transmitter to transmit the signaling to the receiver at a fourth time with a second pilot at the first frequency;
   determining a third energy of the signaling received at the receiver at a third frequency for the first time, the third frequency being a first higher order harmonic of the first frequency;
   determining a fourth energy of the signaling received at the receiver at the third frequency for the second time;
   determining a first difference between the first energy and the second energy;
   determining a second difference between the third energy and the fourth energy; and
   predicting non-linear performance of the network based on a trend derived from at least the first and second differences.

* * * * *